US011493583B1

(12) United States Patent
Majeed et al.

(10) Patent No.: US 11,493,583 B1
(45) Date of Patent: Nov. 8, 2022

(54) IMAGE-BASED RETROSPECTIVE GATING OF MR IMAGES FOR PRF THERMOMETRY

(71) Applicant: Siemens Healthcare GmbH, Erlangen (DE)

(72) Inventors: Waqas Majeed, Ellicott City, MD (US); Himanshu Bhat, Newton, MA (US); Axel Joachim Krafft, Hemhofen (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/518,067

(22) Filed: Nov. 3, 2021

(51) Int. Cl.
    *G01V 3/00* (2006.01)
    *G01R 33/48* (2006.01)

(52) U.S. Cl.
    CPC ................ *G01R 33/4804* (2013.01)

(58) Field of Classification Search
    CPC ........ G01R 33/34; G01R 33/36; G01R 33/38; G01R 33/3804; G01R 33/381; G01R 33/3815; G01R 33/385; G01R 33/34007; G01R 33/3635; G01R 33/3642; G01R 33/48; G01R 33/4804; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/56358
See application file for complete search history.

(56) References Cited

U.S. PATENT DOCUMENTS

| 10,307,619 B2 * | 6/2019 | Levy | G06T 7/248 |
| 2011/0248714 A1 * | 10/2011 | Salomir | G01R 33/4804 324/309 |
| 2015/0247908 A1 * | 9/2015 | Liu | A61B 5/015 324/309 |
| 2020/0166593 A1 * | 5/2020 | Rinott | A61N 7/02 |

* cited by examiner

*Primary Examiner* — Thang X Le

(57) ABSTRACT

Embodiments provide a computer-implemented method for selecting thermal images for generating a temperature difference map through proton resonance frequency (PRF) thermometry, including: acquiring a set of baseline images prior to a thermal treatment of an organ of interest; identifying a subset of baseline images in a most stable motion state from the set of baseline images; averaging the subset of baseline images to generate a template image; determining an acceptance threshold based on an image similarity measure (ISM) between each of the set of baseline images and the template image; acquiring a set of thermal images during the thermal treatment; and selecting a subset of thermal images from the set of thermal images, wherein each of the subset of thermal images has the image similarity measure above the acceptance threshold.

20 Claims, 13 Drawing Sheets

IMAGE-BASED RETROSPECTIVE GATING OF MR IMAGES FOR PRF THERMOMETRY

TECHNICAL FIELD

The present invention relates generally to snapshot Magnetic Resonance Imaging (MRI) based Proton Resonance Frequency (PRF) thermometry, and, more particularly, to image-based retrospective gating of snapshot images to mitigate the impact of between-frame motion during snapshot image acquisition for PRF thermometry.

BACKGROUND

Proton Resonance Frequency (PRF) thermometry is a widely used MRI-based technique to monitor changes in tissue temperature in response to thermal therapy. The PRF thermometry is indispensable for thermal therapies (e.g., High Intensity Focused Ultrasound (HIFU) and Laser based heating) to ensure delivery of desired thermal dose to the target tissue, and to minimize unintended damage to the normal tissue.

During the thermal treatment, a patient is placed in an MRI scanner, which is used to locate a targeted tissue to be ablated, monitor a temperature change using MM thermometry data, and produce detailed images of the targeted tissue, so that the physician can observe the treatment situation in real time.

The temperature rise causes a change in the MR phase images. The proton resonance frequency shift (PRFS) based Magnetic Resonance (MR) thermometry method captures this temperature change by subtracting a phase image acquired prior to the thermal therapy (also called a "baseline") from a phase image with temperature rise during thermal therapy, and the temperature difference ($\Delta T$) is calculated by Equation 1 below:

$$\Delta T = \frac{\phi_{therm} - \phi_{base}}{\alpha \gamma B_0 TE} = \frac{\Delta \phi}{\alpha \gamma B_0 TE} \quad (1)$$

In Equation 1, $\gamma$ is the gyromagnetic ratio, TE is echo time, $\phi_{therm}$ and $\phi_{base}$ are a phase during a thermal therapy, and a phase at a baseline (i.e., prior to thermal therapy), respectively.

However, PRF thermometry of moving organs, such as the liver and the heart, is especially challenging due to motion within and between the acquisition of images (i.e., frames) used for thermometry. Between-frame motion causes misalignment between images used for phase subtraction, and therefore degrades the accuracy of temperature difference estimates (because temperature difference $\Delta T$ is proportionally related to phase difference $\Delta\Phi$ between images).

The existing approaches to minimize misalignment between snapshot MR phase images include navigator-gated acquisition, physiological signal-gated acquisition, and intensity-based image registration.

In the navigator-gated acquisition, the motion-state of the organ of interest during its periodic motion can be determined by means of a navigator. Image acquisition is triggered when the organ is in the desired state of motion as estimated using the navigator. This approach lacks versatility, because pulse sequence and the reconstruction program need to be adapted to enable navigator-gated acquisition. Additionally, navigator signals only allow a crude estimation of the state of motion, because the navigator signals capture only a small sub-portion of k-space (typically around the k-space center).

In the physiological signal-gated acquisition, the motion-state of the organ of interest during its periodic motion can be determined using one or more physiological signals, such as an electrocardiogram (ECG) recording and/or respiratory bellows signals. Image acquisition is triggered when the organ is in the desired state of motion as estimated using physiological signals. This approach is negatively impacted by irregular patterns/artifacts during physiological signal detection and unreliability of certain physiological signals, e.g., respiratory bellows signal. Additionally, physiological signal variation may not have 1-1 correspondence to organ displacement.

In the intensity-based image registration, the acquired images are geometrically transformed to match a template image. This is a versatile approach since it is independent of the imaging sequence. However, it requires close initial alignment between the images to be registered. The through-plane motion may not be corrected for 2D acquisitions in case of poor initial alignment.

The present disclosure is directed to overcoming these and other problems of the prior art.

SUMMARY

Embodiments of the present invention address and overcome one or more of the above shortcomings and drawbacks, by providing methods, systems, and articles of manufacture for selecting thermal images for generating a temperature difference map through PRF thermometry.

Embodiments provide a computer-implemented method for selecting thermal images for generating a temperature difference map through proton resonance frequency (PRF) thermometry, comprising: acquiring a set of baseline images prior to a thermal treatment of an organ of interest; identifying a subset of baseline images in a most stable motion state from the set of baseline images; averaging the subset of baseline images to generate a template image; determining an acceptance threshold based on an image similarity measure (ISM) between each of the set of baseline images and the template image; acquiring a set of thermal images during the thermal treatment; and selecting a subset of thermal images from the set of thermal images, wherein each of the subset of thermal images has the image similarity measure above the acceptance threshold.

Embodiments further provide a computer-implemented method, if the organ of interest is a liver, the most stable motion state is exhalation; if the organ of interest is a heart, the most stable motion state is in diastole.

Embodiments further provide a computer-implemented method, wherein the subset of baseline images include the most mutually similar baseline images.

Embodiments further provide a computer-implemented method, wherein the most mutually similar baseline images are identified based on correlation or negated mean-squared difference between the set of baseline images.

Embodiments further provide a computer-implemented method, wherein the set of baseline images are temporally sorted to reflect mutual similarity between the set of baseline images in a correlation matrix.

Embodiments further provide a computer-implemented method, wherein the subset of baseline images account for a ratio R of the set of baseline images, the acceptance threshold is (1−R)*100th percentile ISM value, and the subset of thermal images are expected to account for the ratio R of the set of thermal images.

Embodiments further provide a computer-implemented method, wherein the ISM is a correlation between each of the set of baseline images and the template image, and a correlation threshold is determined based on the ratio R.

Embodiments further provide a computer-implemented method, wherein the correlation threshold is dynamically adapted to ensure that the ratio R is a fixed ratio over time.

Embodiments further provide a computer-implemented method, further comprising smoothing each of the subset of baseline images.

Embodiments further provide a computer-implemented method, further comprising registering each of the subset of baseline images.

Embodiments further provide a computer-implemented method, further comprising registering the selected subset of thermal images to the template image.

Embodiments provide a snapshot magnetic resonance imaging system configured to select thermal images for generating a temperature difference map through proton resonance frequency (PRF) thermometry, comprising: a magnetic resonance imaging (MRI) device for monitoring a thermal treatment; and a computer system configured to: acquire a set of baseline images prior to the thermal treatment of an organ of interest; generate a pairwise similarity matrix between the set of baseline images; identify a subset of baseline images in a most stable motion state from the set of baseline images based on the pairwise similarity matrix; average the subset of baseline images to generate a template image; calculate an image similarity measure value between each of the set of baseline images and the template image; determine an acceptance threshold to ensure that a ratio R of the set of baseline images have an image similarity measure value above the acceptance threshold, wherein the subset of baseline images account for the ratio R of the set of baseline images; acquire a set of thermal images during the thermal treatment; and select a subset of thermal images from the set of thermal images, wherein each of the subset of thermal images has the image similarity measure value above the acceptance threshold.

Embodiments further provide a snapshot magnetic resonance imaging system, wherein the set of baseline images are temporally sorted to reflect mutual similarity between the set of baseline images in the correlation matrix.

Embodiments further provide a snapshot magnetic resonance imaging system, wherein the subset of thermal images are expected to account for the ratio R of the set of thermal images.

Embodiments further provide a snapshot magnetic resonance imaging system, wherein the acceptance threshold is dynamically adapted to ensure that the ratio R is a fixed ratio over time.

Embodiments further provide a snapshot magnetic resonance imaging system, wherein the computer system is further configured to: register each of the subset of baseline images; and register the selected subset of thermal images to the template image.

Embodiments provide an article of manufacture for selecting thermal images for generating a temperature difference map through proton resonance frequency (PRF) thermometry, the article of manufacture comprising a non-transitory, tangible computer-readable medium holding computer-executable instructions for performing a method comprising: acquiring a set of magnetic resonance (MR) images of an organ of interest, wherein the set of MR images includes a plurality of baseline images acquired prior to a thermal treatment and a plurality of baseline images acquired during the thermal treatment; generating a correlation matrix between the set of MR images; identifying a subset of MR images in a most stable motion state from the set of MR images based on the correlation matrix; averaging the subset of MR to generate a template image; calculating a correlation between each of the set of MR images and the template image; determining a correlation threshold to ensure that a ratio R of the set of MR images are above the correlation threshold, wherein the subset of MR images account for the ratio R of the set of MR images; acquiring a set of thermal images during the thermal treatment; and selecting a subset of thermal images from the set of thermal images, wherein each of the subset of thermal images has the correlation above the correlation threshold, wherein the subset of thermal images account are expected to account for the ratio R of the set of thermal images.

Embodiments further provide an article of manufacture, wherein the correlation threshold is dynamically adapted to ensure that the ratio R is a fixed ratio over time.

Embodiments further provide an article of manufacture, the method further comprising smoothing each of the subset of baseline images.

Embodiments further provide an article of manufacture, the method further comprising: registering each of the subset of baseline images; and registering the selected subset of thermal images to the template image.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, embodiments are shown in the drawings that are presently preferred; however, it is understood that the invention is not limited to the specific instrumentalities disclosed. Included in the drawings are the following Figures.

DETAILED DESCRIPTION

This disclosure provides a novel image analysis approach to mitigate the impact of periodic between-frame motion during snapshot MR image acquisition for PRF thermometry. This disclosure uses image-based retrospective gating of snapshot MR images for PRF thermometry. That is to say, this disclosure provides a method and a system of selecting thermal images for the computation of phase difference, which corresponds to a temperature difference map. The snapshot MR images can be acquired without a navigator and/or physiological monitoring.

In an embodiment, a set of baseline images is acquired. The most stable motion state (i.e., a state that has minimum motion) of a tissue or organ is identified based on analysis of the set of baseline images, e.g., based on a pairwise image similarity matrix (such as a correlation matrix) between the set of baseline images. All the baseline images in the most stable motion state are averaged to generate a template image. An acceptance criterion (i.e., a criterion or threshold for retrospective gating) is determined based on the similarity of baseline images with respect to the template image, based on, e.g., correlation of each baseline image in the set with respect to the template image. The thermal images acquired for thermometry are accepted or rejected based on the acceptance criterion. Only the accepted thermal images are used to generate temperature difference maps.

Figure 1:
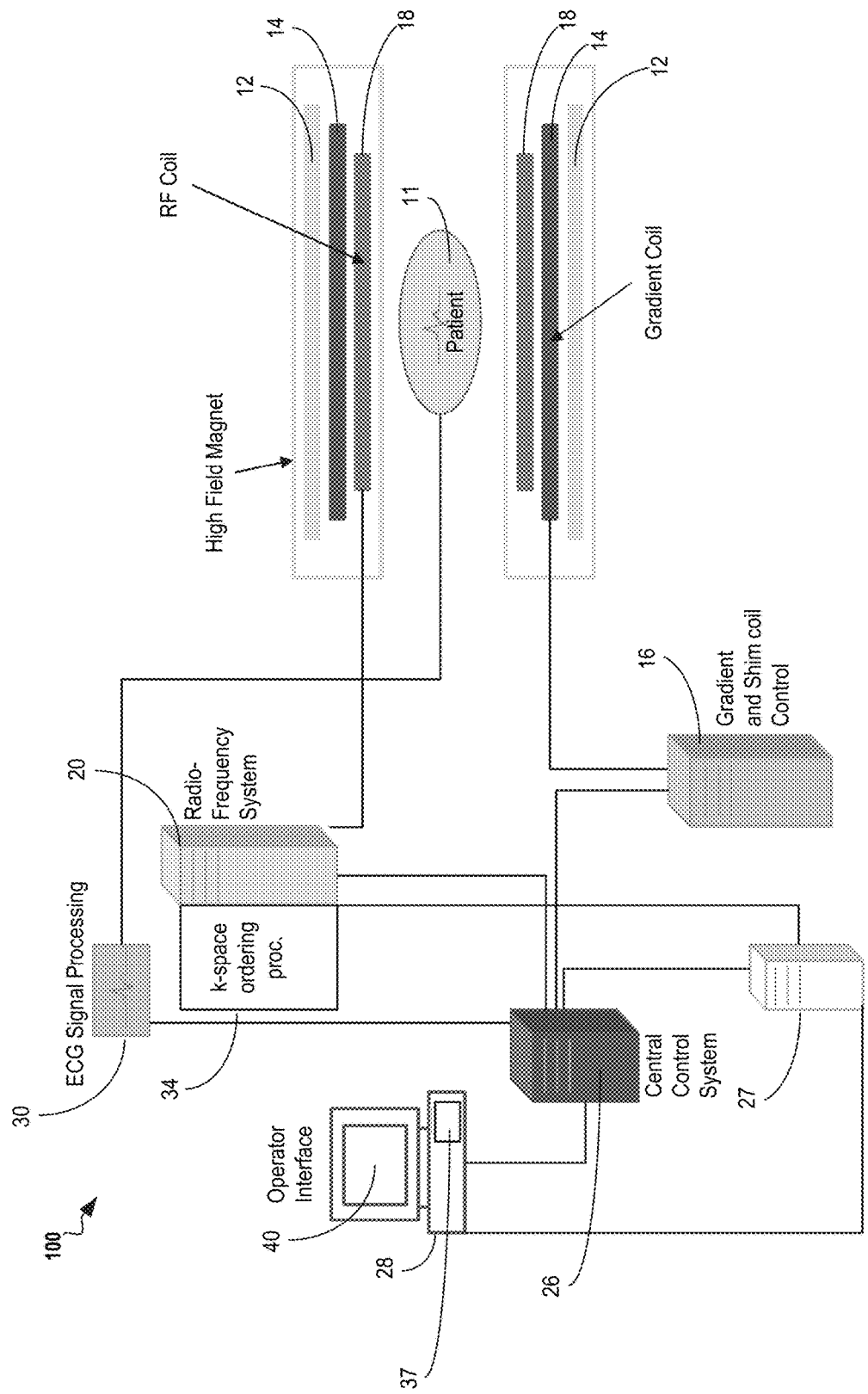
FIG. 1 is a schematic diagram of an exemplary Mill system, consistent with disclosed embodiments.

All of the MR images are acquired by an MRI system. The MR images acquired prior to thermal treatment can be called baseline images, while MR images acquired during the thermal treatment can be called thermal images. FIG. 1 shows an MRI system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position-dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field gradient pulses for magnetic resonance imaging pulse sequences. The shimmed gradients compensate for inhomogeneity and variability in an MRI device magnetic field resulting from patient anatomical variation and other sources. The magnetic field gradients include, for example, a dark-blood preparation magnetic field, a slice-selection gradient magnetic field, a phase-encoding gradient magnetic field, and a data readout gradient magnetic field that are applied to a selected anatomical area of interest of the patient 11.

A radio frequency (RF) module 20 provides RF pulse signals to RF coil 18, which in response produces magnetic field pulses which rotate the spins of the protons in the imaged body of the patient 11 by 90 degrees or by 180 degrees for the so-called "spin echo" imaging, or by angles less than or equal to 90 degrees for so-called "gradient echo" imaging. Gradient and shim coil control module 16 in conjunction with RF module 20, as directed by central control system 26, control dark-blood preparation, data readout, slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space ordering processor unit 34 to provide a magnetic resonance dataset to an image data processor for processing into an image. In some embodiments, the image data processor is located in the central control system 26. However, in other embodiments such as the one depicted in FIG. 1, the image data processor is located in a separate unit 27. Electrocardiogram (ECG) signal processing 30 provides ECG signals used for pulse sequence and imaging synchronization. A two or three dimensional k-space storage array of individual data elements in k-space ordering processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field and a sequence of gradient (coils 14) and RF (coil 18) pulses for use in acquiring multiple individual frequency components corresponding to individual data elements in the storage array. The individual frequency components are successively acquired, for example, using an imaging trajectory with, e.g., a Cartesian or a radial path as described in further detail below. A storage processor in the k-space ordering processor unit 34 stores individual frequency components acquired using the magnetic field in corresponding individual data elements in the array. The radius (i.e., location in the k-space) of respective corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

Central control system 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation, and spatial volume of gradient magnetic fields to be applied in imaging. Generated images are presented on display 40 of the operator interface. Computer 28 of the operator interface includes a graphical user interface (GUI) enabling user interaction with central control system 26 and enables user modification of magnetic resonance imaging signals in substantially real time. Continuing with reference to FIG. 1, display processor 37 processes the magnetic resonance signals to reconstruct one or more images for presentation on display 40. Various techniques known in the art may be used for reconstruction.

Figure 2:
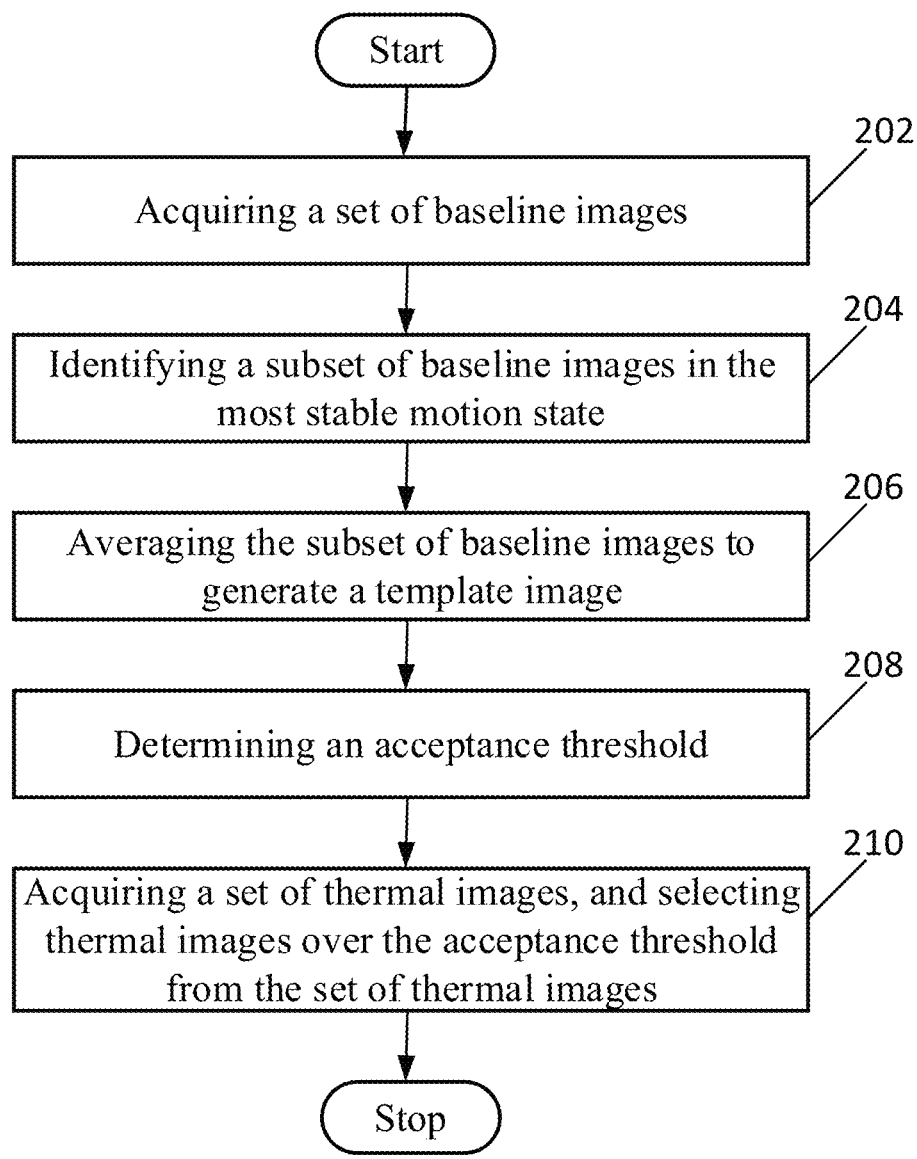
FIG. 2 is a flowchart illustrating an exemplary method of selecting thermal images for generating a temperature difference map, consistent with disclosed embodiments.
Figure 3A:
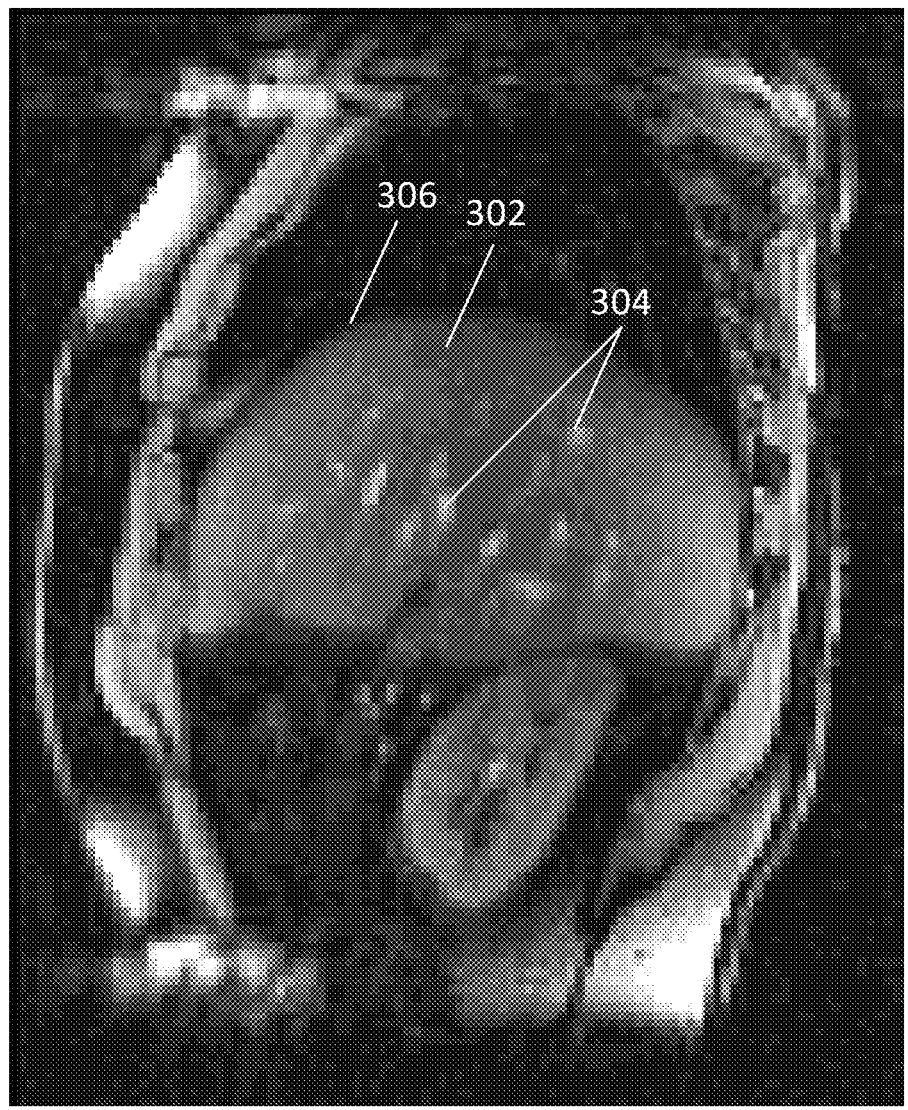
FIG. 3A shows an illustrative temporal mean image of baseline images of a liver, consistent with disclosed embodiments.
Figure 3B:
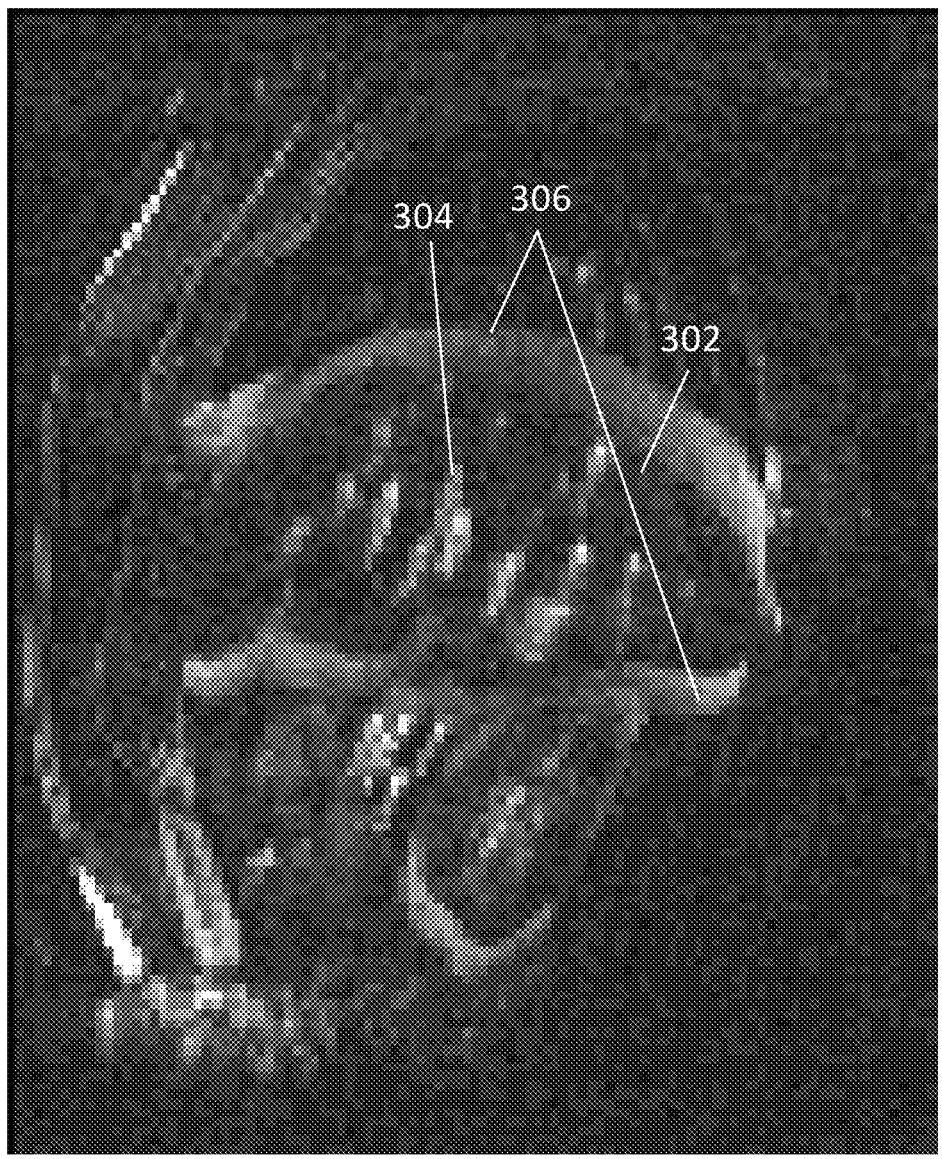
FIG. 3B shows an illustrative standard deviation image of baseline images of the liver, consistent with disclosed embodiments.

In an embodiment, as shown in FIG. 2, a method of selecting thermal images for generating a temperature difference map (i.e., a method of image-based retrospective gating of snapshot MR images for PRF thermometry) is provided as below:

At step 202, a set of baseline images are acquired prior to thermal treatment (i.e., without external heating). A set of baseline images (the number of baseline images is referred to as "nB") are acquired using a thermometry imaging sequence. FIG. 3A shows an illustrative temporal mean image of baseline images of a liver 302 and FIG. 3B shows an illustrative standard deviation image of baseline images of the liver 302. As shown in FIG. 3A, the boundaries 306 of the liver 302 and the blood vessels 304 are blurred. FIG. 3B further shows a high standard deviation of the boundaries 306 of the liver 302 and the blood vessels 304. Blurred features in the temporal mean image and high standard deviation at organ boundaries 306 indicate misalignment between the set of baseline images. The number of baseline images "nB" refers to the number of baseline images used to determine the retrospective gating criterion. In an embodiment, these baseline images can also serve as baseline images for the removal of the background phase from the accepted thermal images for temperature mapping. These baseline images are acquired in the absence of external heating.

At step 204, a subset of baseline images in the most stable motion state are identified from the set of baseline images. For example, if the organ of interest is a liver, the liver is in a most stable motion state at the end of exhalation. If the organ of interest is a heart, the heart is in a most stable motion state at the end of the diastole. The baseline images acquired in the most stable motion state are mutually similar, because there is little motion in the most stable motion state. The subset of baseline images including the most mutually similar baseline images (the number of the subset of baseline images is referred to as R*nB, wherein R is a proportion of the most mutually similar baseline images in the set of baseline images) are identified from the set of baseline images (nB) based on the chosen Image Similarity Measure (ISM), e.g., correlation coefficient, negated mean-squared difference, etc. ISM refers to a measure to quantify the similarity between MR images. The acceptance ratio "R" corresponds to a "fraction" of thermal images to be accepted for temperature mapping. The acceptance ratio "R" is proportionate to the time the organ of interest is expected to stay in its most stable motion state.

Figure 4:
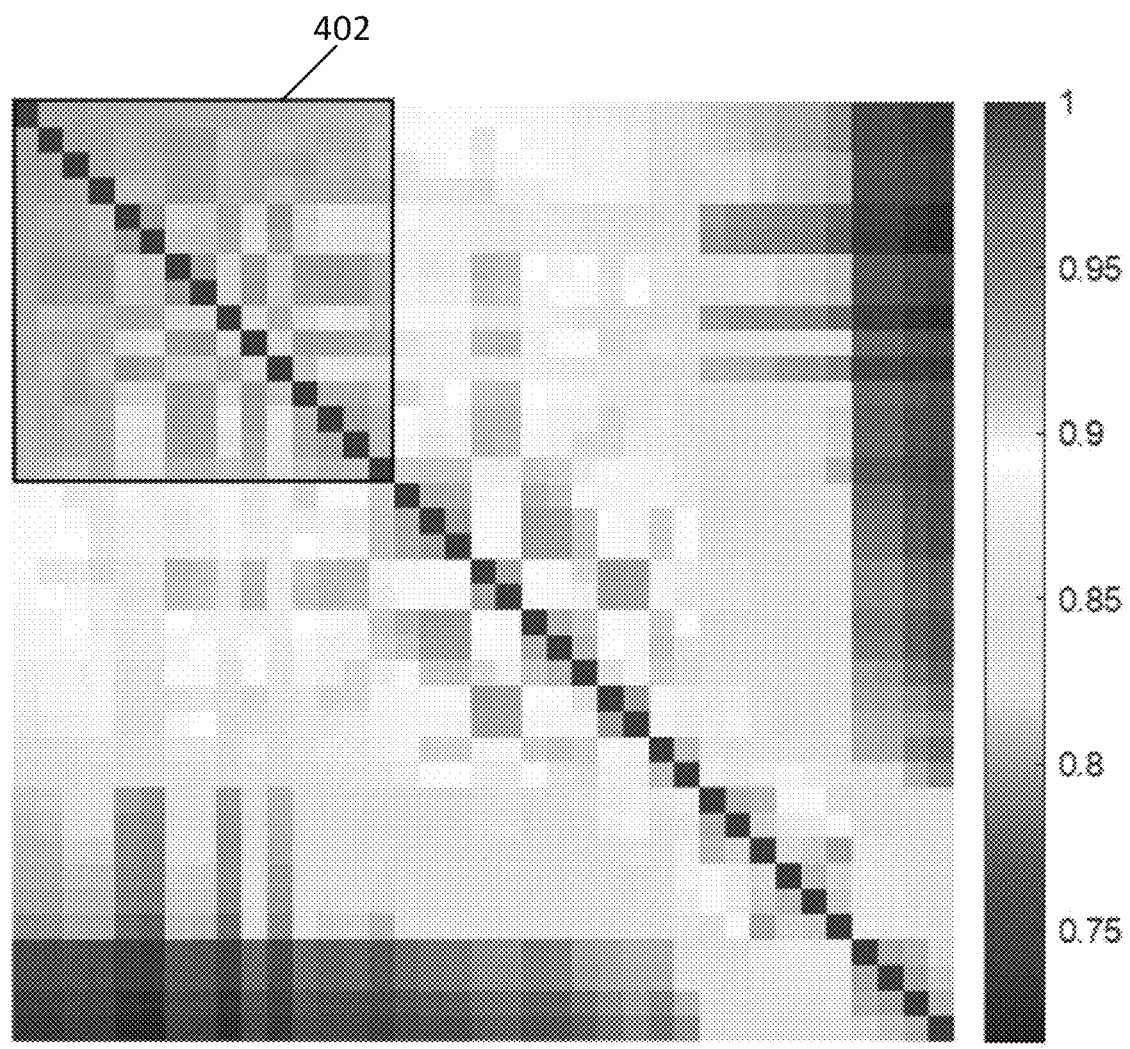
FIG. 4 shows an illustrative correlation matrix between the set of baseline images, consistent with disclosed embodiments.

The subset of baseline images correspond to the most stable motion state, given the acceptance ratio R. FIG. 4 shows a correlation matrix between the set of baseline images. The set of baseline images are temporally sorted to reflect the mutual similarity between the set of baseline images. As shown in FIG. 4, the subset of baseline images 402 (e.g., R=0.4=40%) appear as a cluster indicated on the top-left corner of the correlation matrix. In this example of FIG. 4, the correlation matrix (consisting of pairwise correlation values between the set of the baseline images) is used to assess the mutual similarity between baseline images. However, in general, any image similarity measure, instead of a correlation matrix, can also be used.

Figure 5A:
FIG. 5A shows an illustrative temporal mean image of the subset of baseline images, consistent with disclosed embodiments.
Figure 5B:
FIG. 5B shows an illustrative standard deviation image of the subset of baseline images, consistent with disclosed embodiments.

FIG. 5A shows an illustrative temporal mean image of the subset of baseline images and FIG. 5B shows an illustrative standard deviation image of the subset of baseline images. Compared with FIG. 3A, the temporal mean image of FIG. 5A is crisper (e.g., blood vessels and organ boundaries are clearly discriminated). Compared with FIG. 3B, the standard deviation in FIG. 5B is reduced at the organ boundaries. FIGS. 5A and 5B demonstrate that the subset of baseline images represent a stable motion state.

At step 206, the subset of baseline images are averaged to generate a template image, i.e., a high signal-to-noise ratio (SNR) representation of the most stable motion state. The subset of baseline images are averaged, i.e., the magnitudes of the subset of baseline images are averaged, to form a template image. The temporal mean image, as shown in FIG. 5A, is an illustrative template image.

At step 208, an acceptance threshold is determined. An ISM (e.g., correlation of baseline images with respect to the template image) is calculated between the template image and each of the set of baseline images acquired at step 202. The acceptance threshold is determined as (1−R)*100th percentile ISM value. For example, if R=0.4, the acceptance threshold is (1−0.4)*100th percentile ISM, i.e., $60^{th}$ percentile ISM value, which means that 60% of the set of baseline images are unacceptable or rejected, while 40% of the set of baseline images are acceptable. 40% of the set of baseline images correspond to the subset of baseline images acquired in the most stable motion state.

Figure 6:
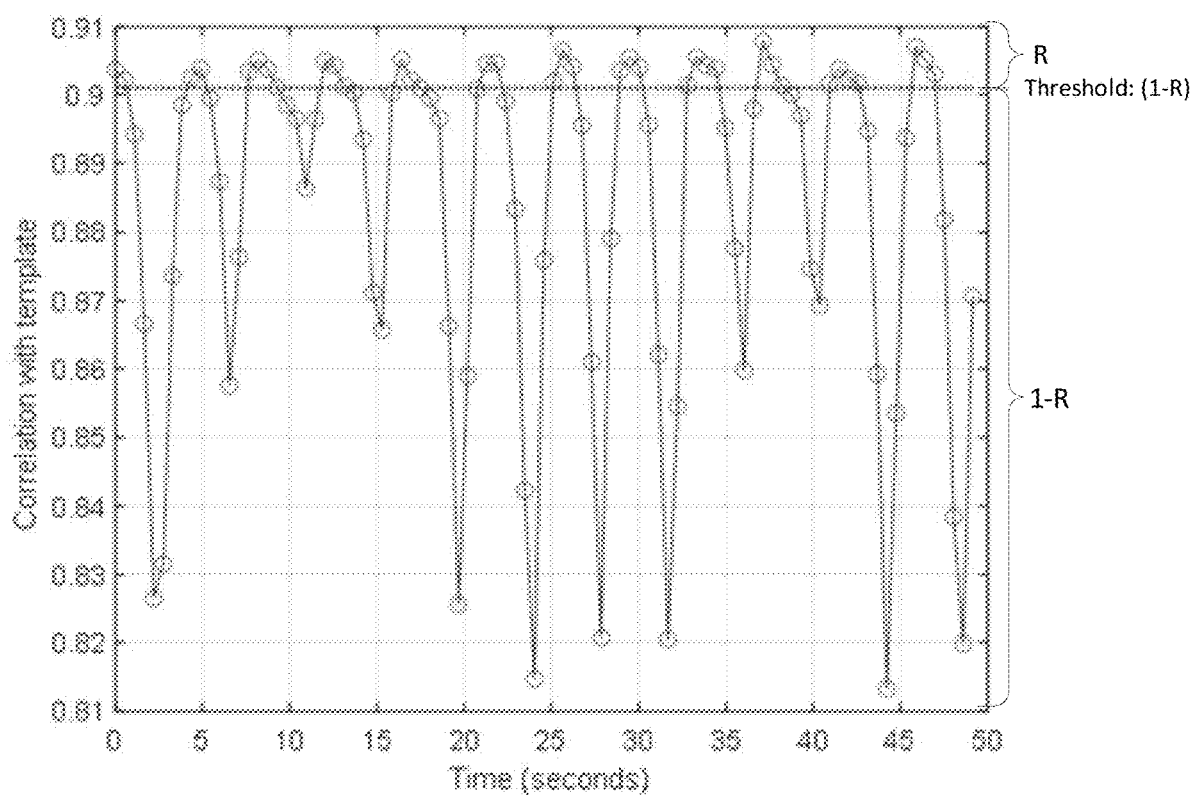
FIG. 6 shows an illustrative correlation of the baseline images with respect to the template image, consistent with disclosed embodiments.

In an example, correlation of the set of baseline images with respect to the template image is shown in FIG. 6. Each point on FIG. 6 corresponds to a correlation of a baseline image with respect to the template image. Any baseline images with correlation above the acceptance threshold (e.g., $60^{th}$ percentile correlation between the set of baseline images and the template image) are accepted to serve as reference images for thermometry baseline correction. The acceptance threshold can also be used as the acceptance criterion for thermal images, assuming periodicity of the physiological motion of the organ. In this example, the correlation threshold is 0.905 (the correlation value of 0.905 can make sure that 40% of the set of baseline images are acceptable), and any baseline images with a correlation above 0.905 are accepted. That is to say, the baseline images with correlation above 0.905 account for 40% of the set of baseline images, while the baseline images with correlation below 0.905 account for 60% of the set of baseline images. The "acceptance ratio" and the "acceptance threshold" are different concepts. The "acceptance ratio" refers to a proportion of MR images to be accepted, while the "acceptance threshold" (e.g., correlation threshold) refers to a specific threshold value of ISM to obtain the proportion of MR images to be accepted.

At step 210, a set of thermal images are acquired during thermal treatment (i.e., with external heating), and thermal images for temperature difference maps are selected from the set of thermal images. Any thermal images with ISM (e.g., correlation of a thermal image with respect to the template image, based on similarity of thermal image's magnitude to the template image's magnitude) above the acceptance threshold can be accepted for computation of phase difference, which is further used for temperature difference maps (because temperature difference ΔT is proportionally related to phase difference ΔΦ between thermal images).

Figure 7A:
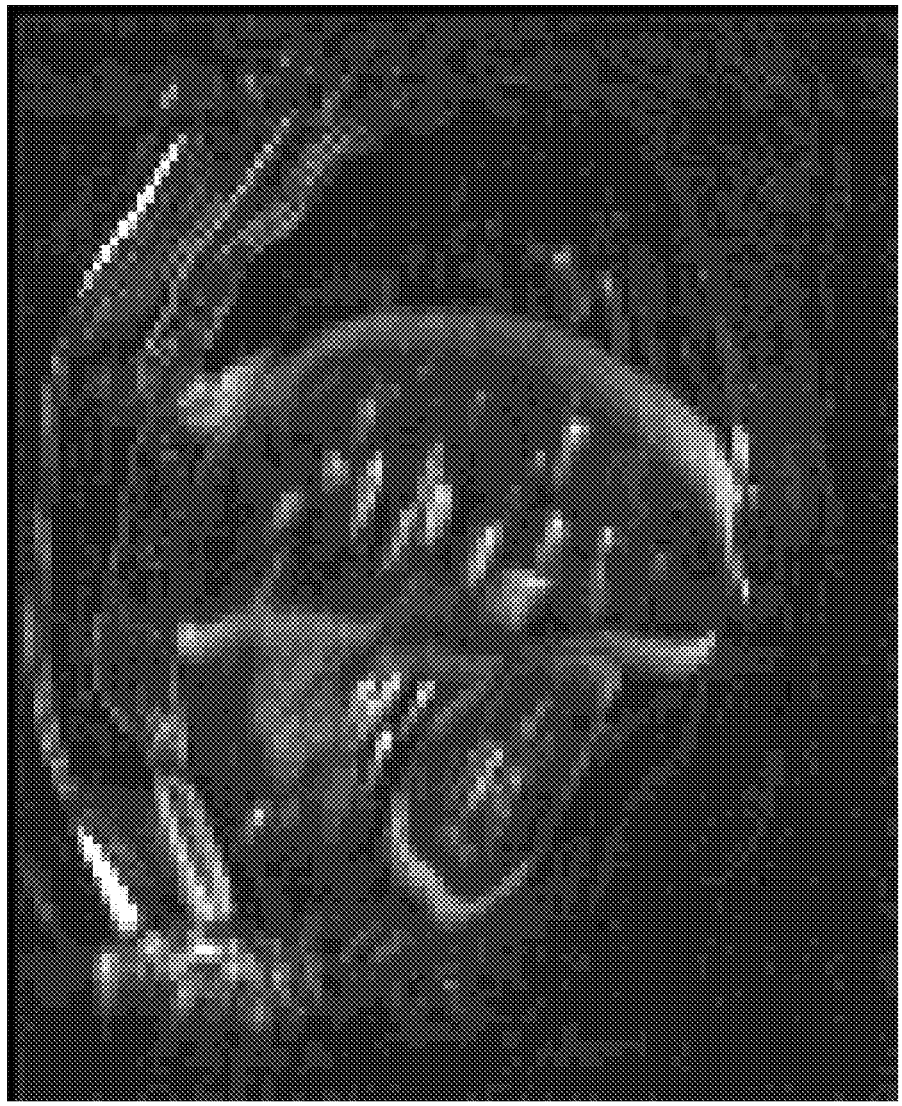
FIG. 7A shows an illustrative standard deviation image of all the thermal images, consistent with disclosed embodiments.
Figure 7B:
FIG. 7B shows an illustrative standard deviation image of the accepted thermal images, consistent with disclosed embodiments.
Figure 8A:
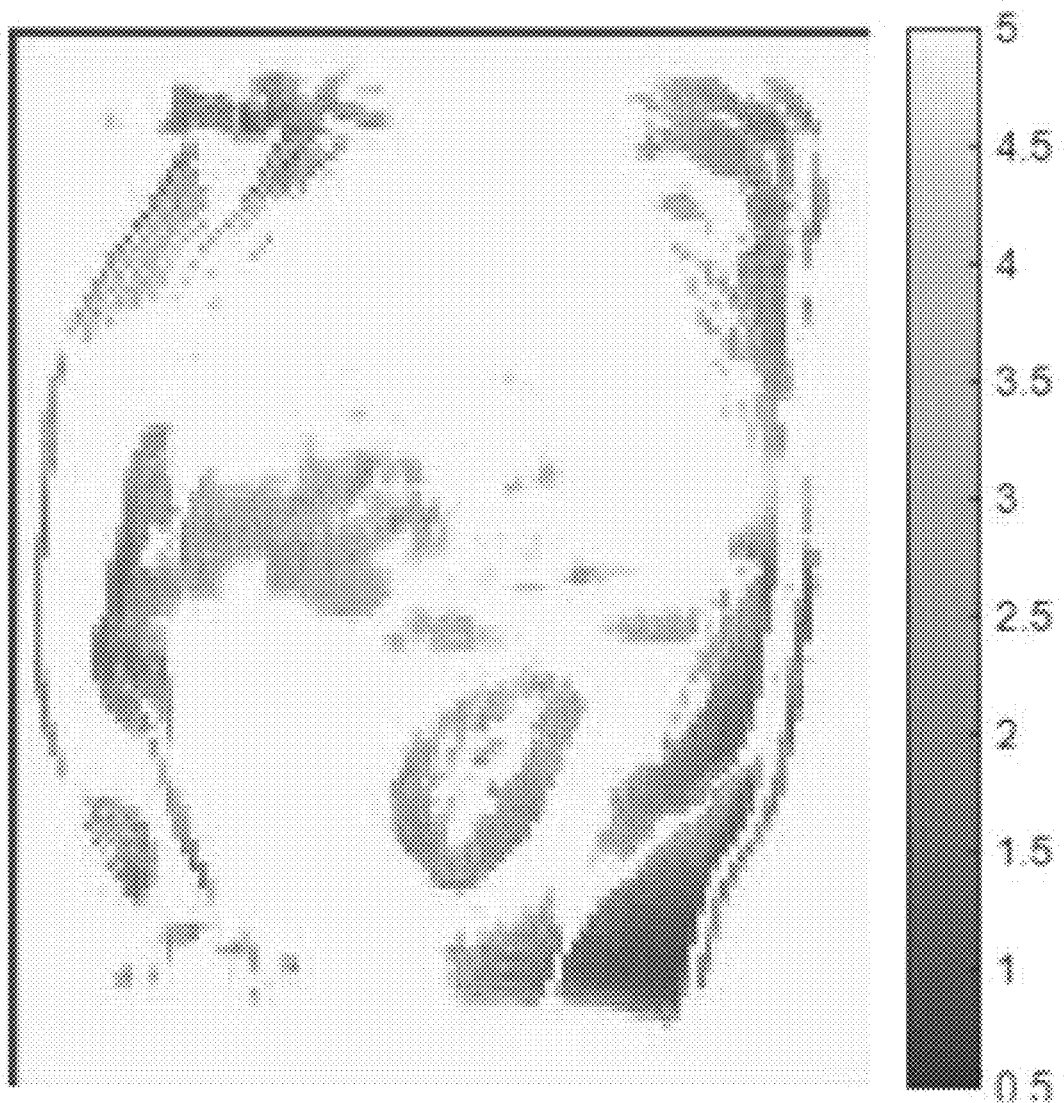
FIG. 8A shows an illustrative standard deviation of PRF temperature difference ΔT estimated based on all the thermal images, consistent with disclosed embodiments.
Figure 8B:
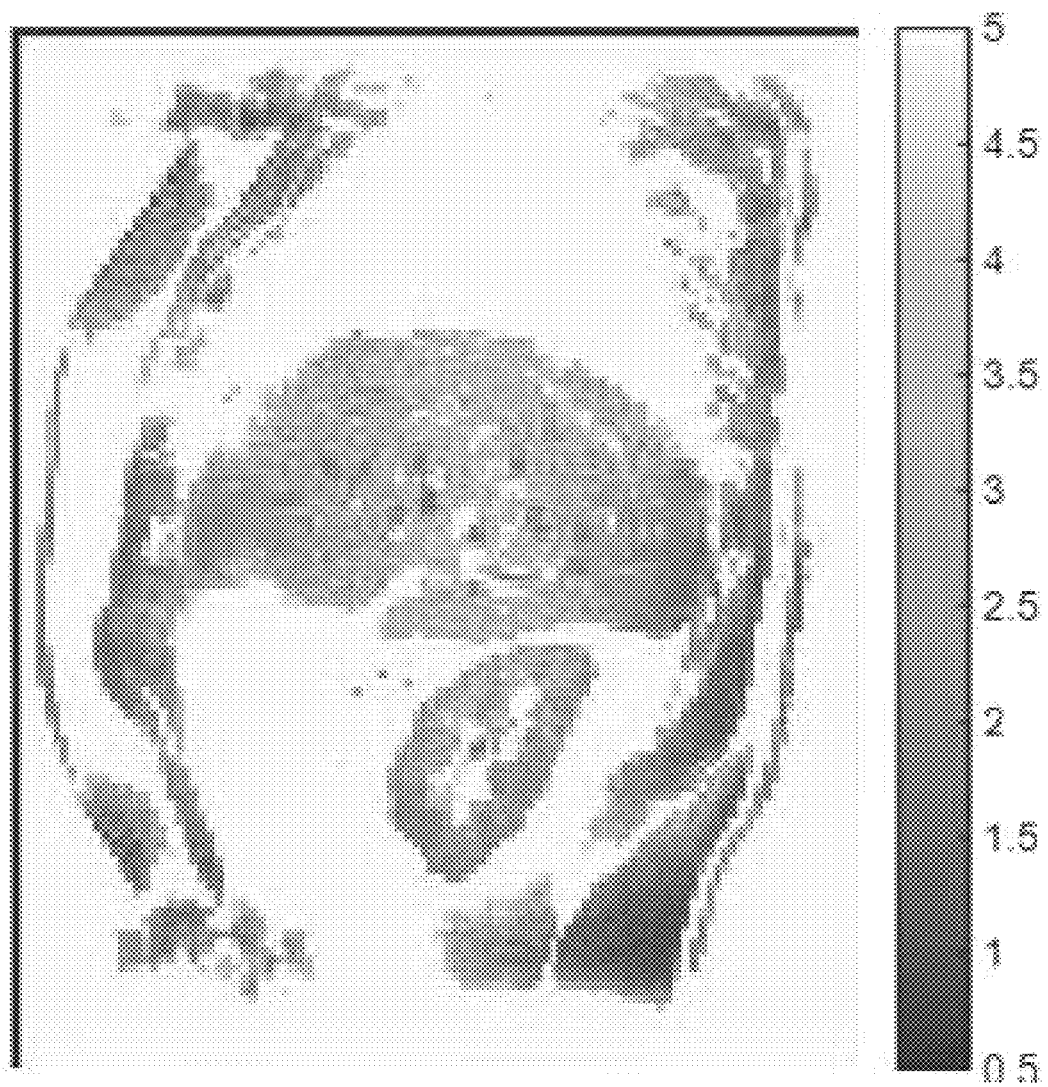
FIG. 8B shows an illustrative standard deviation of PRF temperature difference ΔT estimated based on the accepted thermal images, consistent with disclosed embodiments.

Image-based retrospective gating (i.e., selecting thermal images for generating a temperature difference map) results in a reduction in temporal standard deviation. FIG. 7A shows an illustrative standard deviation image of the magnitude of all the thermal images (i.e., the set of thermal images). FIG. 7B shows an illustrative standard deviation image of the magnitude of the accepted thermal images (i.e., thermal images above the acceptance threshold, e.g., based on 40% acceptance ratio R). The organ boundaries and blood vessels in FIG. 7B exhibit reduced standard deviation, demonstrating improved alignment between the accepted thermal images. FIG. 8A shows an illustrative standard deviation of PRF temperature difference ΔT estimated based on all the thermal images. FIG. 8B shows an illustrative standard deviation of PRF temperature difference ΔT estimated based on the accepted thermal images. FIG. 7B and FIG. 8B can demonstrate improved alignment between thermal images selected for temperature difference maps, resulting in a reduction in the standard deviation of PRF ΔT estimates.

In an embodiment, the acceptance threshold, e.g., correlation threshold, is a fixed value, e.g., 0.905, and the acceptance threshold is determined using the set of baseline images only. In another embodiment, the acceptance threshold (e.g., correlation threshold) can be dynamically adapted to take into consideration a potential drift in the most stable motion state (e.g., the drift can be introduced because of a shallower breathing pattern over time). For example, at step 208, the correlation of a thermal image with respect to the template image may be decreased due to a shallower breathing pattern over time. If the correlation threshold is kept as 0.905, then fewer than 40% of the set of thermal images can be selected. In this case, the acceptance threshold, e.g., correlation threshold, can be decreased (e.g., 0.85, 0.8, etc.) over time to ensure that 40% of the set of thermal images are selected, and hence the acceptance ratio (0.4, or 40%) is maintained over time.

In another embodiment, at step 202, the nB acquisitions used to determine the acceptance threshold can include both baseline images and thermal images, instead of including only baseline images. The acceptance threshold ((1−R)× 100th percentile ISM value) can be calculated based on the most recent nB acquisitions including both baseline images and thermal images.

In another embodiment, at step 202, the acquired set of baseline images can be smoothed to reduce sensitivity to drift and temperature-related intensity changes, as well as noises. The smoothing (i.e., blurring) of the set of baseline images can make the ISM between the template image and thermal images less sensitive to slight motion.

In another embodiment, at step 206, each of the subset of baseline images can be registered prior to being averaged to generate the template image. The registration of the subset of baseline images can mitigate slight misalignments of the subset of baseline images with each other.

In another embodiment, the thermal images accepted at step 210 can be registered to the template image before calculating the temperature difference. The registration of the accepted thermal images can mitigate residual misalignments between the accepted thermal images with the template image.

In an embodiment, the approach of image-based retrospective gating described in this disclosure can be used in combination with prospective physiological gating or navigator gating. For example, the method of image-based retrospective gating can serve as a quality-control method to further refine images acquired using prospective physiological gating or navigator gating.

The approach of image-based retrospective gating does not require additional hardware for physiological signal recording (e.g., ECG). Due to snapshot MM acquisitions applied in the approach, the approach is independent of the imaging sequence. Further, no additional acquisitions for navigation are needed.

The retrospective gating of this approach relies on actual MR images, instead of an indirect assessment of organ motion. Thus, the accuracy and reliability of retrospective gating are increased. The acquired images are retrospectively gated based on image similarity, instead of relying on navigators or physiological signals. This approach can facilitate PRF thermometry for moving organs.

Figure 9:
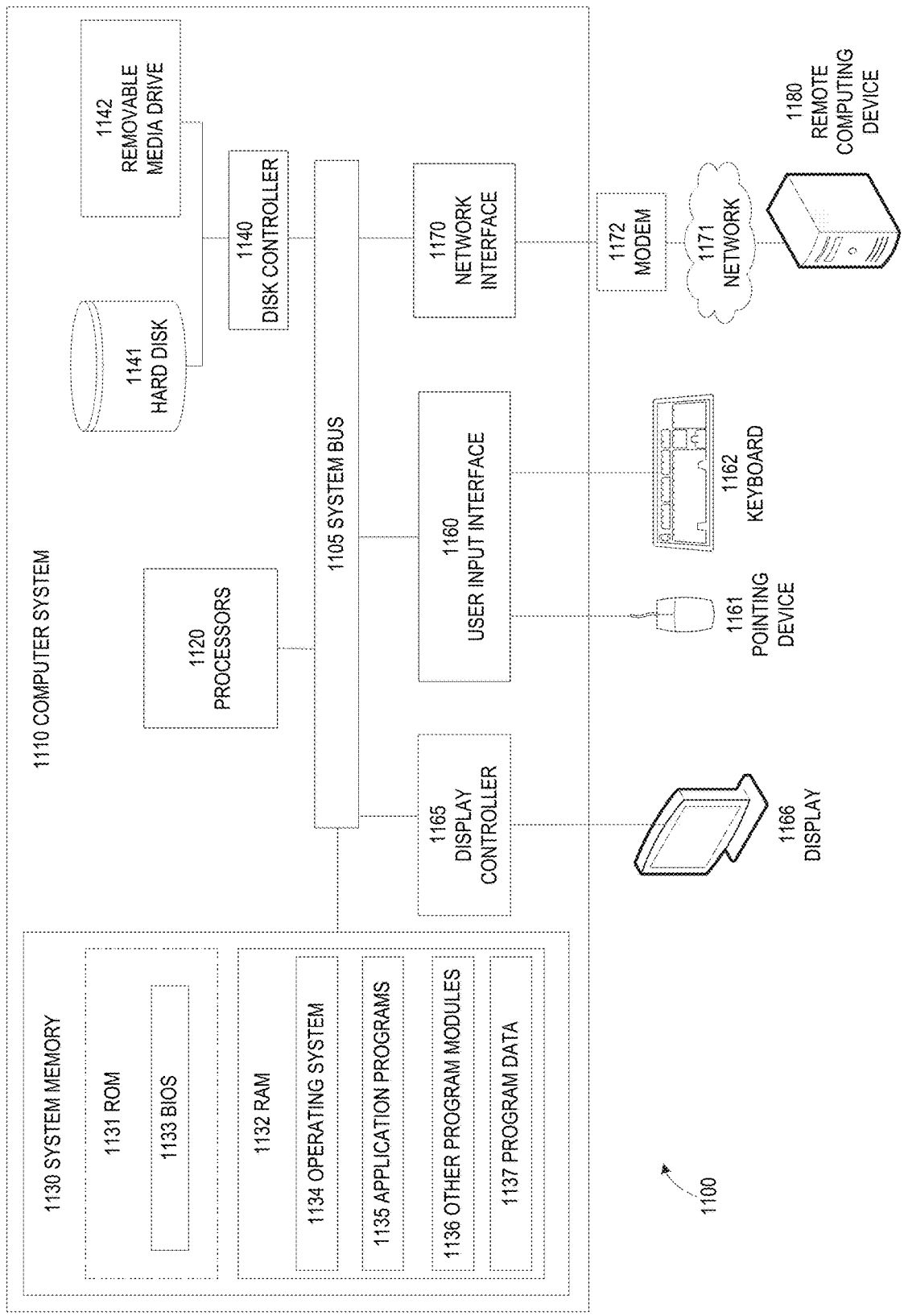
FIG. 9 illustrates an exemplary computing environment within which embodiments of the invention may be implemented.

FIG. 9 illustrates an exemplary computing environment 1100 within which embodiments of the invention may be implemented. For example, this computing environment 1100 may be configured to execute an imaging process performed by the MRI system 100. The computing environment 1100 may include computer system 1110, which is one example of a computing system upon which embodiments of the invention may be implemented. Computers and computing environments, such as computer system 1110 and computing environment 1100, are known to those of skill in the art and thus are described briefly here.

As shown in FIG. 9, the computer system 1110 may include a communication mechanism such as a bus 1105 or another communication mechanism for communicating information within the computer system 1110. The computer system 1110 further includes one or more processors 1120 coupled with the bus 1105 for processing the information. The processors 1120 may include one or more central processing units (CPUs), graphical processing units (GPUs), or any other processor known in the art.

The computer system 1110 also includes a system memory 1130 coupled to the bus 1105 for storing information and instructions to be executed by processors 1120. The system memory 1130 may include computer readable storage media in the form of volatile and/or nonvolatile memory, such as read only memory (ROM) 1131 and/or random access memory (RAM) 1132. The system memory RAM 1132 may include other dynamic storage device(s) (e.g., dynamic RAM, static RAM, and synchronous DRAM). The system memory ROM 1131 may include other static storage device(s) (e.g., programmable ROM, erasable PROM, and electrically erasable PROM). In addition, the system memory 1130 may be used for storing temporary variables or other intermediate information during the execution of instructions by the processors 1120. A basic input/output system (BIOS) 1133 containing the basic routines that help to transfer information between elements within computer system 1110, such as during start-up, may be stored in ROM 1131. RAM 1132 may contain data and/or program modules that are immediately accessible to and/or presently being operated on by the processors 1120. System memory 1130 may additionally include, for example, operating system 1134, application programs 1135, other program modules 1136 and program data 1137.

The computer system 1110 also includes a disk controller 1140 coupled to the bus 1105 to control one or more storage devices for storing information and instructions, such as a hard disk 1141 and a removable media drive 1142 (e.g., floppy disk drive, compact disc drive, tape drive, and/or solid state drive). The storage devices may be added to the computer system 1110 using an appropriate device interface (e.g., a small computer system interface (SCSI), integrated device electronics (IDE), Universal Serial Bus (USB), or FireWire).

The computer system 1110 may also include a display controller 1165 coupled to the bus 1105 to control a display 1166, such as a cathode ray tube (CRT) or liquid crystal display (LCD), for displaying information to a computer user. The computer system 1110 includes an input interface 1160 and one or more input devices, such as a keyboard 1162 and a pointing device 1161, for interacting with a computer user and providing information to the processor 1120. The pointing device 1161, for example, may be a mouse, a trackball, or a pointing stick for communicating direction information and command selections to the processor 1120 and for controlling cursor movement on the display 1166. The display 1166 may provide a touch screen interface that allows input to supplement or replace the communication of direction information and command selections by the pointing device 1161.

The computer system 1110 may perform a portion or all of the processing steps of embodiments of the invention in response to the processors 1120 executing one or more sequences of one or more instructions contained in a memory, such as the system memory 1130. Such instructions may be read into the system memory 1130 from another computer readable medium, such as a hard disk 1141 or a removable media drive 1142. The hard disk 1141 may contain one or more datastores and data files used by embodiments of the present invention. Datastore contents and data files may be encrypted to improve security. The processors 1120 may also be employed in a multi-processing arrangement to execute the one or more sequences of instructions contained in system memory 1130. In alternative embodiments, hard-wired circuitry may be used in place of or in combination with software instructions. Thus, embodiments are not limited to any specific combination of hardware circuitry and software.

As stated above, the computer system 1110 may include at least one computer readable medium or memory for holding instructions programmed according to embodiments of the invention and for containing data structures, tables, records, or other data described herein. The term "computer readable medium" as used herein refers to any medium that participates in providing instructions to the processor 1120 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 1141 or removable media drive 1142. Non-limiting examples of volatile media include dynamic memory, such as system memory 1130. Non-limiting examples of transmission media include coaxial cables, copper wire, and fiber optics, including the wires that make up the bus 1105. Transmission media may also take the form of acoustic or light waves, such as those generated during radio wave and infrared data communications.

The computing environment 1100 may further include the computer system 1110 operating in a networked environment using logical connections to one or more remote computers, such as remote computer 1180. Remote computer 1180 may be a personal computer (laptop or desktop), a mobile device, a server, a router, a network PC, a peer device or other common network node, and typically includes many or all of the elements described above relative to computer system 1110. When used in a networking environment, computer system 1110 may include modem 1172 for establishing communications over a network 1171, such as the Internet. Modem 1172 may be connected to bus 1105 via user network interface 1170, or via another appropriate mechanism.

Network 1171 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1110 and other computers (e.g., remote computer 1180). The network 1171 may be wired, wireless, or a combination thereof. Wired connections may be implemented using Ethernet, Universal Serial Bus (USB), RJ-11, or any other wired connection generally known in the art. Wireless connections may be implemented using Wi-Fi, WiMAX, and Bluetooth, infrared, cellular networks, satellite, or any other wireless connection methodology generally known in the art. Additionally, several networks may work alone or in communication with each other to facilitate communication in the network 1171.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system, or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images generated by a display processor, enabling user interaction with a processor or other device and associated data acquisition and processing functions. The GUI also includes an executable procedure or executable application. The executable procedure or executable application conditions the display processor to generate signals representing the GUI display images. These signals are supplied to a display device that displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to a user command. An activity (including a step) performed automatically is performed in response to one or more executable instructions or device operations without user direct initiation of the activity.

The system and processes of the figures are not exclusive. Other systems, processes, and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers, and processes can be implemented using hardware components, software components, and/or combinations thereof. No claim element herein is to be construed under the provisions of 35 USC 112(f) unless the element is expressly recited using the phrase "means for."

The invention claimed is:

1. A computer-implemented method for selecting thermal images for generating a temperature difference map through proton resonance frequency (PRF) thermometry, comprising:
    acquiring a set of baseline images prior to a thermal treatment of an organ of interest;
    identifying a subset of baseline images in a most stable motion state from the set of baseline images;
    averaging the subset of baseline images to generate a template image;
    determining an acceptance threshold based on an image similarity measure (ISM) between each of the set of baseline images and the template image;
    acquiring a set of thermal images during the thermal treatment; and
    selecting a subset of thermal images from the set of thermal images, wherein each of the subset of thermal images has the image similarity measure above the acceptance threshold.

2. The computer-implemented method of claim 1, if the organ of interest is a liver, the most stable motion state is at end of exhalation; if the organ of interest is a heart, the most stable motion state is at end of diastole.

3. The computer-implemented method of claim 1, wherein the subset of baseline images include the most mutually similar baseline images.

4. The computer-implemented method of claim 3, wherein the most mutually similar baseline images are identified based on correlation or negated mean-squared difference between the set of baseline images.

5. The computer-implemented method of claim 3, wherein the set of baseline images are temporally sorted to reflect mutual similarity between the set of baseline images in a correlation matrix.

6. The computer-implemented method of claim 1, wherein the subset of baseline images account for a ratio R of the set of baseline images, the acceptance threshold is (1−R)*100th percentile ISM value, and the subset of thermal images are expected to account for the ratio R of the set of thermal images.

7. The computer-implemented method of claim 6, wherein the ISM is a correlation between each of the set of baseline images and the template image, and a correlation threshold is determined based on the ratio R.

8. The computer-implemented method of claim 7, wherein the correlation threshold is dynamically adapted to ensure that the ratio R is a fixed ratio over time.

9. The computer-implemented method of claim 1, further comprising smoothing each of the subset of baseline images.

10. The computer-implemented method of claim 1, further comprising registering each of the subset of baseline images.

11. The computer-implemented method of claim 1, further comprising registering the selected subset of thermal images to the template image.

12. A snapshot magnetic resonance imaging system configured to select thermal images for generating a temperature difference map through proton resonance frequency (PRF) thermometry, comprising:
    a magnetic resonance imaging (MRI) device for monitoring a thermal treatment; and
    a computer system configured to:
        acquire a set of baseline images prior to the thermal treatment of an organ of interest;
        generate a pairwise similarity matrix between the set of baseline images;
        identify a subset of baseline images in a most stable motion state from the set of baseline images based on the pairwise similarity matrix;
        average the subset of baseline images to generate a template image;
        calculate an image similarity measure value between each of the set of baseline images and the template image;
        determine an acceptance threshold to ensure that a ratio R of the set of baseline images have an image similarity measure value above the acceptance threshold, wherein the subset of baseline images account for the ratio R of the set of baseline images;
        acquire a set of thermal images during the thermal treatment; and
        select a subset of thermal images from the set of thermal images, wherein each of the subset of thermal images has the image similarity measure value above the acceptance threshold.

13. The system of claim 12, wherein the set of baseline images are temporally sorted to reflect mutual similarity between the set of baseline images in the correlation matrix.

14. The system of claim 12, wherein the subset of thermal images are expected to account for the ratio R of the set of thermal images.

15. The system of claim 14, wherein the acceptance threshold is dynamically adapted to ensure that the ratio R is a fixed ratio over time.

16. The system of claim 12, wherein the computer system is further configured to:
    register each of the subset of baseline images; and
    register the selected subset of thermal images to the template image.

17. An article of manufacture for selecting thermal images for generating a temperature difference map through proton resonance frequency (PRF) thermometry, the article of manufacture comprising a non-transitory, tangible computer-readable medium holding computer-executable instructions for performing a method comprising:
    acquiring a set of magnetic resonance (MR) images of an organ of interest, wherein the set of MR images includes a plurality of baseline images acquired prior to a thermal treatment and a plurality of baseline images acquired during the thermal treatment;
    generating a correlation matrix between the set of MR images;

identifying a subset of MR images in a most stable motion state from the set of MR images based on the correlation matrix;

averaging the subset of MR to generate a template image;

calculating a correlation between each of the set of MR images and the template image;

determining a correlation threshold to ensure that a ratio R of the set of MR images are above the correlation threshold, wherein the subset of MR images account for the ratio R of the set of MR images;

acquiring a set of thermal images during the thermal treatment; and selecting a subset of thermal images from the set of thermal images, wherein each of the subset of thermal images has the correlation above the correlation threshold, wherein the subset of thermal images account are expected to account for the ratio R of the set of thermal images.

18. The article of manufacture of claim 17, wherein the correlation threshold is dynamically adapted to ensure that the ratio R is a fixed ratio over time.

19. The article of manufacture of claim 17, the method further comprising smoothing each of the subset of baseline images.

20. The article of manufacture of claim 17, the method further comprising:

registering each of the subset of baseline images; and registering the selected subset of thermal images to the template image.

* * * * *